US012322587B2

(12) United States Patent
Jeong et al.

(10) Patent No.: US 12,322,587 B2
(45) Date of Patent: Jun. 3, 2025

(54) SUBSTRATE DRYING APPARATUS AND SEMICONDUCTOR DEVICE MANUFACTURING METHOD USING SAME

(71) Applicant: SAMSUNG ELECTRONICS CO., LTD., Suwon-si (KR)

(72) Inventors: Ji Hoon Jeong, Seongnam-si (KR); Seo Hyun Kim, Hwaseong-si (KR); Sang Jine Park, Suwon-si (KR); Young-hoo Kim, Yongin-si (KR); Kun Tack Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 877 days.

(21) Appl. No.: 17/357,632

(22) Filed: Jun. 24, 2021

(65) Prior Publication Data

US 2022/0189765 A1 Jun. 16, 2022

(30) Foreign Application Priority Data

Dec. 15, 2020 (KR) .................. 10-2020-0175231

(51) Int. Cl.
  *H01L 21/02* (2006.01)
(52) U.S. Cl.
  CPC .................. *H01L 21/02101* (2013.01)
(58) Field of Classification Search
  CPC .......... H01L 21/02101; H01L 21/6719; H01L 21/67034; H01L 21/67253; F26B 5/005
  USPC ...................... 34/218, 566; 138/40
  See application file for complete search history.

(56) References Cited

U.S. PATENT DOCUMENTS

| | | | |
|---|---|---|---|
| 5,815,762 A | 9/1998 | Sakai et al. | |
| 6,312,518 B1 | 11/2001 | Kwon | |
| 7,513,265 B2 | 4/2009 | Yoshikawa et al. | |
| 2004/0221875 A1* | 11/2004 | Saga | H01L 21/67057 134/26 |
| 2013/0081658 A1 | 4/2013 | Song et al. | |

(Continued)

FOREIGN PATENT DOCUMENTS

| JP | 2001-324263 A | 11/2001 |
|---|---|---|
| KR | 822373 B1 | 4/2008 |

(Continued)

OTHER PUBLICATIONS

Office Action dated Sep. 27, 2024 issued in Korean Patent Application No. 10-2020-0175231.

*Primary Examiner* — John P McCormack
(74) *Attorney, Agent, or Firm* — MORGAN, LEWIS & BOCKIUS LLP

(57) ABSTRACT

A substrate drying apparatus includes; a drying chamber configured to load a substrate and including a lower chamber and an upper chamber above the lower chamber, a supply port configured to supply a supercritical fluid into the drying chamber and including a main supply port and a sub-supply port horizontally spaced apart from the main supply port, wherein the main supply port penetrates a center portion of the upper chamber, and a first buffer member coupled to the upper chamber, vertically separated from the sub-supply port, and vertically overlapping the sub-supply port, such that supercritical fluid vertically introduced into the drying chamber through the sub-supply port is impeded by the first buffer member to change a flow direction for the supercritical fluid.

20 Claims, 20 Drawing Sheets

(56) References Cited

U.S. PATENT DOCUMENTS

| | | | |
|---|---|---|---|
| 2015/0155188 A1 | 6/2015 | Jung et al. | |
| 2019/0164787 A1 | 5/2019 | Lee et al. | |
| 2020/0035509 A1* | 1/2020 | Khan | H01L 21/67017 |
| 2020/0251316 A1* | 8/2020 | Shimizu | H01L 21/67069 |
| 2021/0305015 A1* | 9/2021 | Sim | H01J 37/3244 |
| 2022/0020609 A1* | 1/2022 | Park | B08B 13/00 |

FOREIGN PATENT DOCUMENTS

| | | | |
|---|---|---|---|
| KR | 1236808 B1 | | 2/2013 |
| KR | 20130014311 A | | 2/2013 |
| KR | 20130134993 A | | 12/2013 |
| KR | 20150062906 A | | 6/2015 |
| KR | 1536712 B1 | | 7/2015 |
| KR | 20170136775 | * | 6/2016 |
| KR | 1736845 B1 | | 5/2017 |
| KR | 20170136775 A | | 12/2017 |

* cited by examiner

SUBSTRATE DRYING APPARATUS AND SEMICONDUCTOR DEVICE MANUFACTURING METHOD USING SAME

CROSS-REFERENCE TO RELATED APPLICATION

This application claims priority under 35 U.S.C. 119 from Korean Patent Application No. 10-2020-0175231 filed on Dec. 15, 2020 in the Korean Intellectual Property Office, the subject matter of which is hereby incorporated by reference.

BACKGROUND

1. Technical Field

The inventive concept relates generally to substrate drying apparatuses and semiconductor device manufacturing methods using same.

2. Description of the Related Art

Contemporary and emerging semiconductor devices are manufactured by forming circuit pattern(s) on a substrate using a number of fabrication processes usually including at least one photolithography process. Recently, a supercritical drying process for semiconductor devices having line width (s) of 30 nm or less has been proposed in which a substrate may be dried by exposure to a supercritical fluid. In this context, the term "supercritical fluid" denotes a fluid having both gas and liquid properties at (or above) a combination of critical temperature and critical pressure. Supercritical fluids exhibit excellent diffusion and penetrating properties, improved dissolving abilities, and little surface tension. Accordingly, a supercritical fluid may be very useful in the drying of a substrate.

SUMMARY

Embodiments of the inventive concept provide semiconductor device manufacturing methods that efficiently dry a substrate without damaging pattern(s) on the substrate (e.g., causing leaning of a pattern).

Embodiments of the inventive concept also provide a substrate drying apparatus capable of efficiently drying a substrate without damaging pattern(s) on the substrate (e.g., causing leaning of a pattern).

However, beneficial aspects associated with embodiments of the inventive concept are not limited to only those expressed set forth herein. The above and other aspects of the inventive concept will become more apparent to those skilled in the art upon consideration of the following detailed description together with the accompanying drawings.

According to an aspect of the inventive concept, a semiconductor device manufacturing method include; loading a substrate into a drying chamber of a drying module, wherein the drying chamber includes a lower chamber and an upper chamber above the lower chamber, and drying the substrate in the drying chamber by supplying a supercritical fluid to the drying chamber through a supply port including a main supply port and a sub-supply port spaced apart from the main supply port in a first direction, wherein the main supply port connects a central portion of the upper chamber, and a buffer member is coupled to the upper chamber and spaced apart from the sub-supply port in a second direction intersecting the first direction to overlap the sub-supply port in the second direction, and measuring pressure of the supercritical fluid in the drying chamber using a pressure meter to determine a measured pressure value.

According to an aspect of the inventive concept, a substrate drying apparatus includes; a drying chamber configured to load a substrate and including a lower chamber and an upper chamber above the lower chamber, a supply port configured to introduce a supercritical fluid into the drying chamber and including a main supply port and a sub-supply port horizontally spaced apart from the main supply port, wherein the main supply port penetrates a center portion of the upper chamber, and a pressure meter configured to measure pressure of the supercritical fluid in the drying chamber and generate a measured pressure value, wherein the supercritical fluid is introduced into the drying chamber through the sub-supply port during a first time period, and the supercritical fluid is introduced into the drying chamber through the main supply port during a second time period following the first time period.

According to an aspect of the inventive concept, a substrate drying apparatus includes; a drying chamber configured to load a substrate and including a lower chamber and an upper chamber above the lower chamber, a supply port configured to supply a supercritical fluid into the drying chamber and including a main supply port and a sub-supply port horizontally spaced apart from the main supply port, wherein the main supply port penetrates a center portion of the upper chamber, and a first buffer member coupled to the upper chamber, vertically separated from the sub-supply port, and vertically overlapping the sub-supply port, such that supercritical fluid vertically introduced into the drying chamber through the sub-supply port is impeded by the first buffer member to change a flow direction for the supercritical fluid.

DETAILED DESCRIPTION

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Hereinafter, various substrate drying apparatus(es) and various substrate drying method(s) according to embodiments of the inventive concept will be described with reference to the foregoing drawings (collectively, "FIGS. 1 to 20"). It should be noted that the drawings may not necessarily be drawn to scale and the proportions of at least some structures may be exaggerated for clarity.

Figure 1:
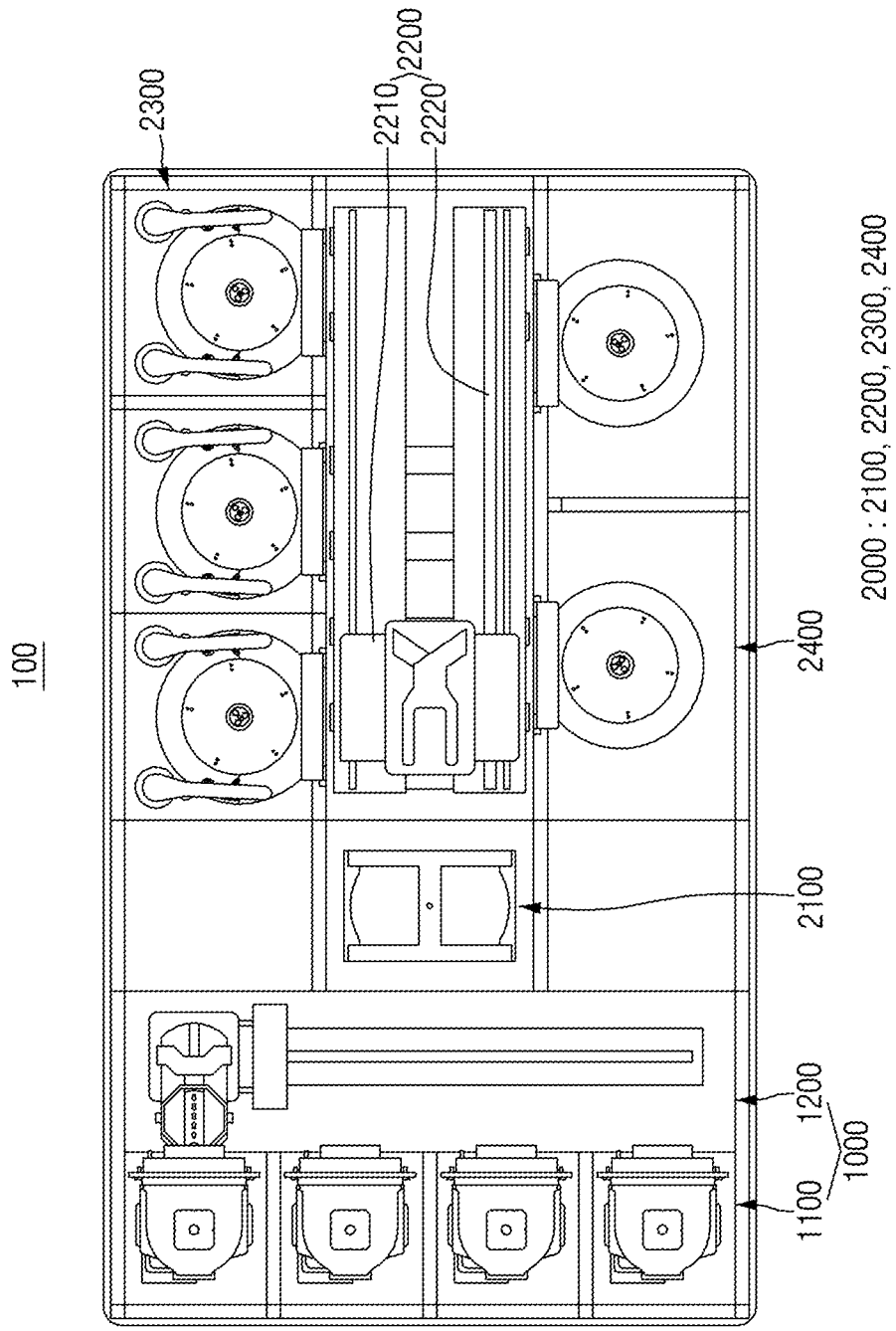
FIG. 1 is a plan (or top-down) view illustrating a substrate processing apparatus including a substrate drying apparatus according to embodiments of the inventive concept.

FIG. 1 is a plan view illustrating a substrate processing apparatus 100 including a substrate drying apparatus according to embodiments of the inventive concept.

Referring to FIG. 1, the substrate processing apparatus 100 may generally include an index module 1000 and a process module 2000.

Here, the index module 1000 may be used to receive an externally provided substrate and transfers the substrate into the process module 2000. Thereafter, the process module 2000 may perform various cleaning process(es) and at least one drying process. In some embodiments, the index module 1000 may be an equipment front end module (EFEM) including at least a load port 1100 and a transfer frame 1200.

The load port 1100 may configured to accommodate a substrate. For example, the substrate may be placed in a container (e.g., a front opening unified pod (FOUP)), and the container may be transferred into the load port 1100 using (e.g.,) an externally provided overhead transfer (OHT). Following cleaning and drying of the substrate, the container may be transferred out the load port 1100 using the overhead transfer. The transfer frame 1200 may be used to transfer the substrate between the container—once the container is loaded in the load port 1100—and the process module 2000.

Here, it is the process module 2000 that actually performs the cleaning and drying of the substrate. Process modules may be variously configured according to the particular nature of the processes performed, but the process module 2000 illustrated in FIG. 1 generally includes a buffer module 2100, a transfer module 2200, a cleaning module 2300, and a drying module 2400.

The buffer module 2100 provides a temporary holding space for the substrate and facilitates the transfer of the substrate between the index module 1000 and the process module 2000. For example, the buffer module 2100 may provide a buffer slot on which a substrate is placed. The transfer robot 2210 of the transfer module 2200 may be used to remove the substrate from the buffer slot, and transfer the substrate to either the cleaning module 2300 or the drying module 2400. Note, that in some embodiments, the buffer module 2100 may include a number of buffer slots.

Thus, the transfer module 2200 may be used to transfer the substrate among the buffer module 2100, the cleaning module 2300, and the drying module 2400 which are respectively disposed proximate to a transfer rail 2220 used by the transfer module 2200. That is, the transfer robot 2210 may move along the transfer rail 2220 to transfer the substrate among the buffer module 2100, the cleaning module 2300, and the drying module 2400.

In this regard, the cleaning module 2300 may be used to perform a cleaning process. Those skilled in the art will recognize that many different cleaning processes may be used according to preceding fabrication process(es) applied to the substrate. But in general, the cleaning module 2300 may perform at least one chemical process and at least one rinsing process. Here, it is common for the cleaning process performed by the cleaning module 2300 to include at least one organic solvent process. In some embodiments, the cleaning module 2300 may be disposed on one side of the transfer module 2200, and the drying module 2400 may be disposed on the other side of the transfer module 2200. That is, the cleaning module 2300 and the drying module 2400 may be arranged across the transfer module 2200 in an opposing (or face-to-face) configuration.

As noted above, one or more cleaning modules 2300 and one or more drying modules 2400 may be variously arranged in the process module 2000. In some embodiments, a number of cleaning modules 2300 may be arranged along one side of the transfer module 2200. However, embodiments of the inventive concept are not limited thereto.

The cleaning module 2300 may selectively perform one or more chemical process(es), one or more rinsing process (es), and one or more organic solvent process(es). Here, the chemical process(es) may be used to remove contaminants (e.g., particles of foreign matter) from a surface of the substrate using various cleaning agent(s). The rinsing process(es) may then be used to remove residue of the cleaning agent(s) remaining on the substrate using various rinsing agent(s). The organic solvent process may then be used to apply organic solvent(s) to the substrate, such that any rinsing agent residue remaining between circuit patterns on the substrate are removed (or substituted) with organic solvent(s) characterized by low surface tension.

Further in this regard, and consistent with embodiments of the inventive concept, the substrate processing apparatus 100 of FIG. 1 may also be used to perform a supercritical process during which the substrate is exposed to a supercritical fluid.

In the foregoing, the term "substrate" has been used in a generic sense to denote a broad class of material components used to manufacture semiconductor devices, flat panel displays (FPD), and other products. Selected examples of a substrate include various semiconductor components (e.g., fabricated wafers), such as silicon components, glass components, etc.

As noted above, a supercritical fluid is a fluid existing a materials state that exhibits gas and liquid properties. That is, when a fluid reaches a supercritical state wherein a critical temperature and a critical pressure are exceeded, the molecular density of a supercritical fluid becomes close to the molecular density of a liquid state, yet the viscosity of a supercritical fluid becomes close to the viscosity of a gaseous state. Accordingly, the supercritical fluid exhibits excellence diffusing and penetrating characteristics and strong dissolving abilities that may be advantageous to certain chemical reactions desirable in a cleaning process. In addition, the supercritical fluid exhibits almost no surface tension, and accordingly, applies little if any interfacial tension on microstructures formed on the substrate (e.g., patterns).

Hence, supercritical process(es) (e.g., a supercritical drying process and/or a supercritical etching process) may be apply to a substrate recognizing the beneficial properties of supercritical fluids. Hereafter, as one example of a supercritical process that may be performed in various embodiments of the inventive concept, a supercritical drying process will be described, but those skilled in the art will understand that this is just an example.

The supercritical drying process may be performed by dissolving an organic solvent residue remaining on a circuit pattern of the substrate using a supercritical fluid to dry the substrate. Thus type of supercritical drying process provides very efficient drying of the substrate, while preventing damage to the fine patterns (e.g., causing leaning of the fine patterns). Hereafter, it is further assumed as a selected example, that the supercritical fluid used in the supercritical drying process is a material compatible with an organic solvent (e.g., supercritical carbon dioxide ($scCO_2$)).

Figure 2:
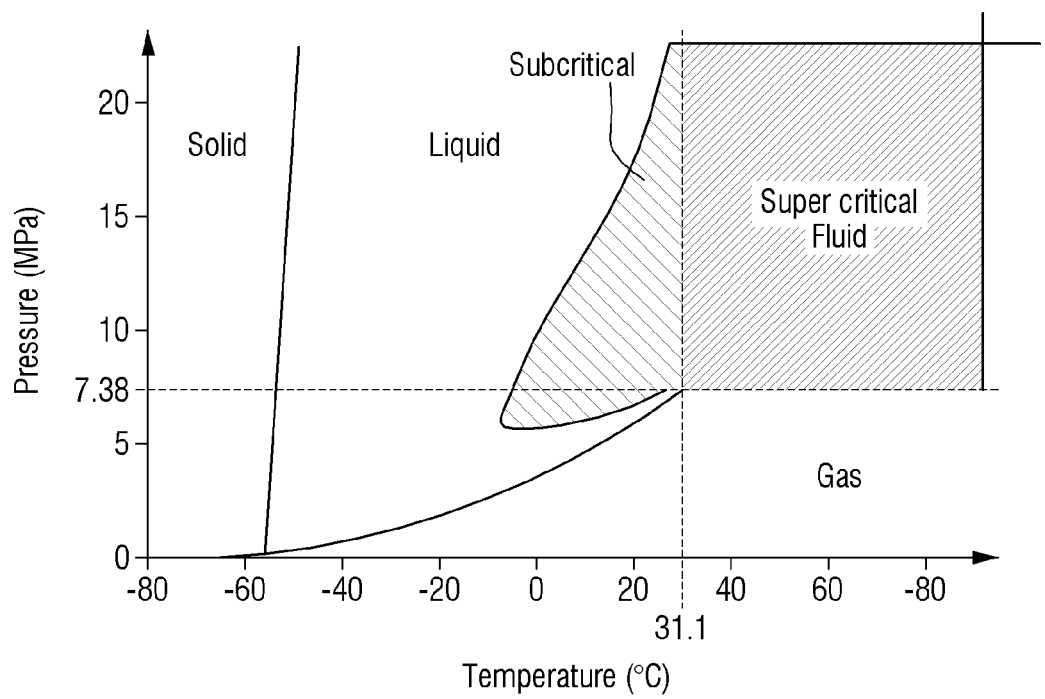
FIG. 2 is a graph illustrating a phase change for carbon dioxide ($CO_2$) under certain temperature/pressure conditions.

FIG. 2 is a graph illustrating a phase change for carbon dioxide ($CO_2$) under certain temperature/pressure conditions.

Referring to FIG. 2, the critical temperature of carbon dioxide is 31.1° C., and the critical pressure is 7.38 Mpa. Carbon dioxide may be readily placed in a supercritical state due to these relatively low critical temperature and critical pressure. Further the state of carbon dioxide is easy to control by controlling applied temperature and pressure. Carbon dioxide is inexpensive, non-flammable, chemically inert and harmless (nontoxic) to humans.

Supercritical carbon dioxide has a diffusion coefficient that is 10 to 100 times greater than the diffusion coefficient of water or other organic solvents. Accordingly, supercritical carbon dioxide has excellent penetration. Supercritical carbon dioxide is also quickly substituted for organic solvents and has almost no surface tension. Accordingly, it has advantageous properties for use in a supercritical drying process for drying a substrate having fine circuit patterns.

Carbon dioxide is produced as a by-product of various chemical reactions. Carbon dioxide may be used in the supercritical drying process, and then converted to gas to separate organic solvents and reused, so that it is less burdensome in terms of environmental pollution.

Hereinafter, a substrate drying apparatus according to embodiments of the inventive concept will be described in some additional detail with reference to FIGS. 3 to 14 and in relation to the substrate drying module 2400 of FIG. 1.

Figure 3:
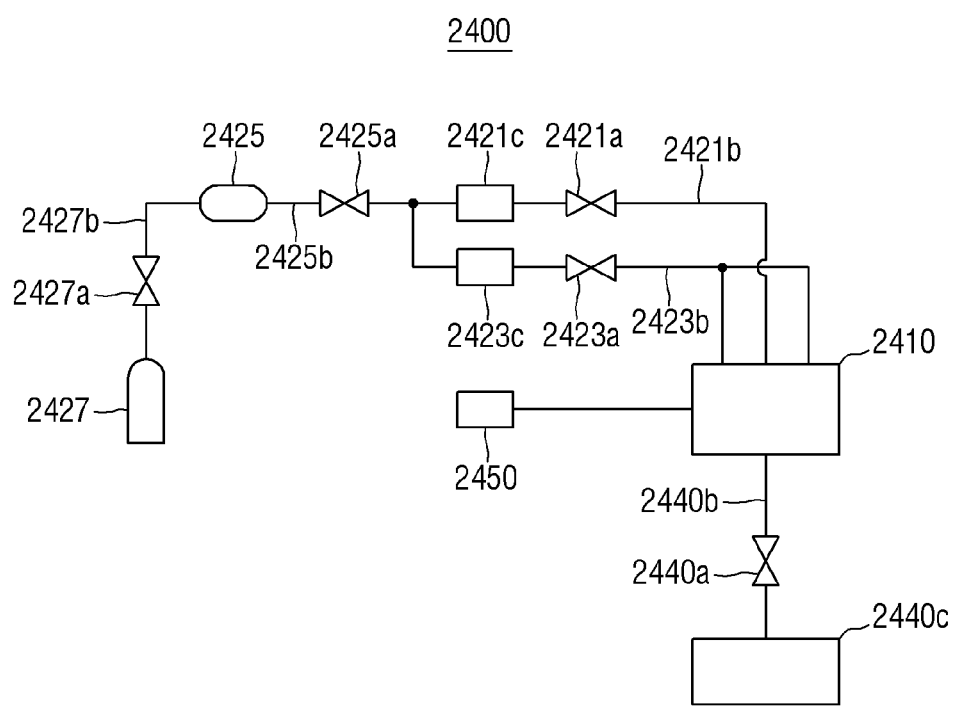
FIG. 3 is a block diagram further illustrating the substrate drying module 240 of FIG. 1.

FIG. 3 is a block diagram further illustrating the substrate drying module 2400 according to embodiments of the inventive concept.

Referring to FIG. 3, the substrate drying module 2400 may include a storage cylinder 2427, a filter 2425, a first storage tank 2421c, a second storage tank 2423c, a drying chamber 2410, a controller 2450, and an exhaust portion 2440c.

The storage cylinder 2427 may store fluid used in a supercritical process. For example, carbon dioxide used in the supercritical process may be stored in the storage cylinder 2427. The carbon dioxide may be stored in a liquefied state in the storage cylinder 2427.

The filter 2425 may serve to remove impurities of the carbon dioxide. The storage cylinder 2427 may be connected to the filter 2425 by a first supply line 2427b. The first supply line 2427b may include a first valve 2427a. When the first valve 2427a is opened, the carbon dioxide in the storage cylinder 2427 may be moved to the filter 2425. The first valve 2427a may adjust the flow rate of the carbon dioxide.

The first storage tank 2421c and the second storage tank 2423c may store the carbon dioxide in a supercritical fluid state. The first storage tank 2421c and the second storage tank 2423c may be connected to the filter 2425 by a second supply line 2425b. The second supply line 2425b may include a second valve 2425a. When the second valve 2425a is opened, carbon dioxide in the filter 2425 may be moved to the first and second storage tanks 2421c and 2423c. The second valve 2425a may adjust the flow rate of the carbon dioxide.

Although not shown in FIG. 3, the first storage tank 2421c may be connected to a main supply port (e.g., 2421 of FIG. 4) by the third supply line 2421b. The supercritical fluid in the first storage tank 2421c may be introduced into the drying chamber 2410 through the third supply line 2421b and the main supply port. The third supply line 2421b may include a third valve 2421a. The third valve 2421a may adjust the flow rate of the supercritical fluid. In this regard, operation (e.g., opening and/or closing) of the various ports (e.g., supply exhaust, etc.) and/or valves in the substrate processing apparatus including the substrate drying apparatus according to embodiments of the inventive concept may be controlled by a controller.

The second storage tank 2423c may be connected to a sub-supply port (e.g., 2423 of FIG. 4) by a fourth supply line 2423b. The supercritical fluid in the second storage tank 2423c may be introduced into the drying chamber 2410 through the fourth supply line 2423b and the sub-supply port. The fourth supply line 2423b may include a fourth valve 2423a. The fourth valve 2423a may adjust the flow rate of the supercritical fluid.

The exhaust portion 2440c may be connected to the drying chamber 2410 through an exhaust line 2440b. The exhaust line 2440b may include a fifth valve 2440a. Although not shown in FIG. 3, the supercritical fluid in the drying chamber 2410 may be discharged from the drying chamber 2410 through an exhaust port (e.g., 2440 in FIG. 4) and the exhaust line 2440b. The fifth valve 2440a may adjust the flow rate of the supercritical fluid discharged to the outside of the drying chamber 2410.

The controller 2450 may be used to control the opening/closing of each of the first to fifth valves 2427a, 2425a, 2421a, 2423a, and 2440a. One example of the controller 2450 will be described in some additional detail with reference to FIGS. 4 and 5.

The drying chamber 2410 may be a chamber in which a supercritical drying process is performed. One example of the drying chamber 2410 will be described in some additional detail with reference to FIGS. 4 and 5.

Figure 4:
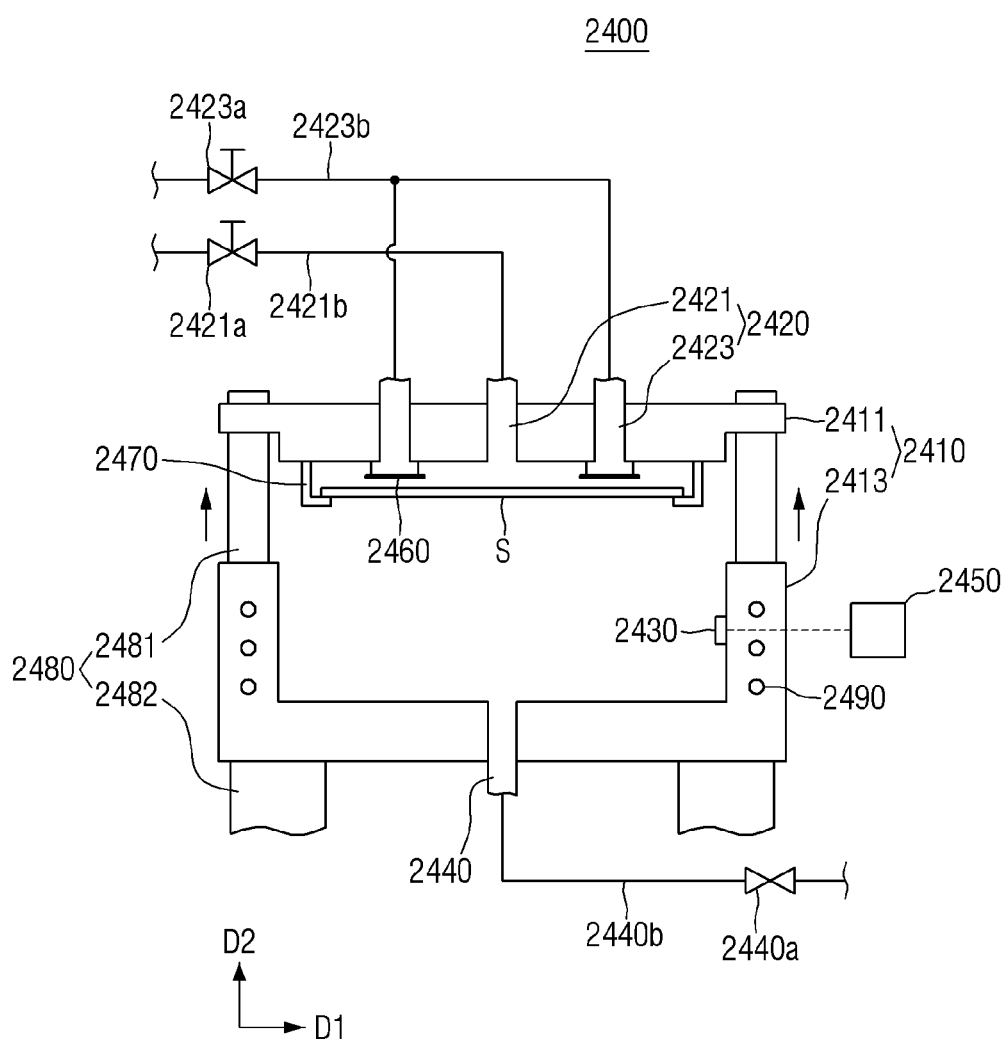
FIGS. 4 and 5 are related cross-sectional views further illustrating the substrate drying module 2400 of FIG. 3.
Figure 5:
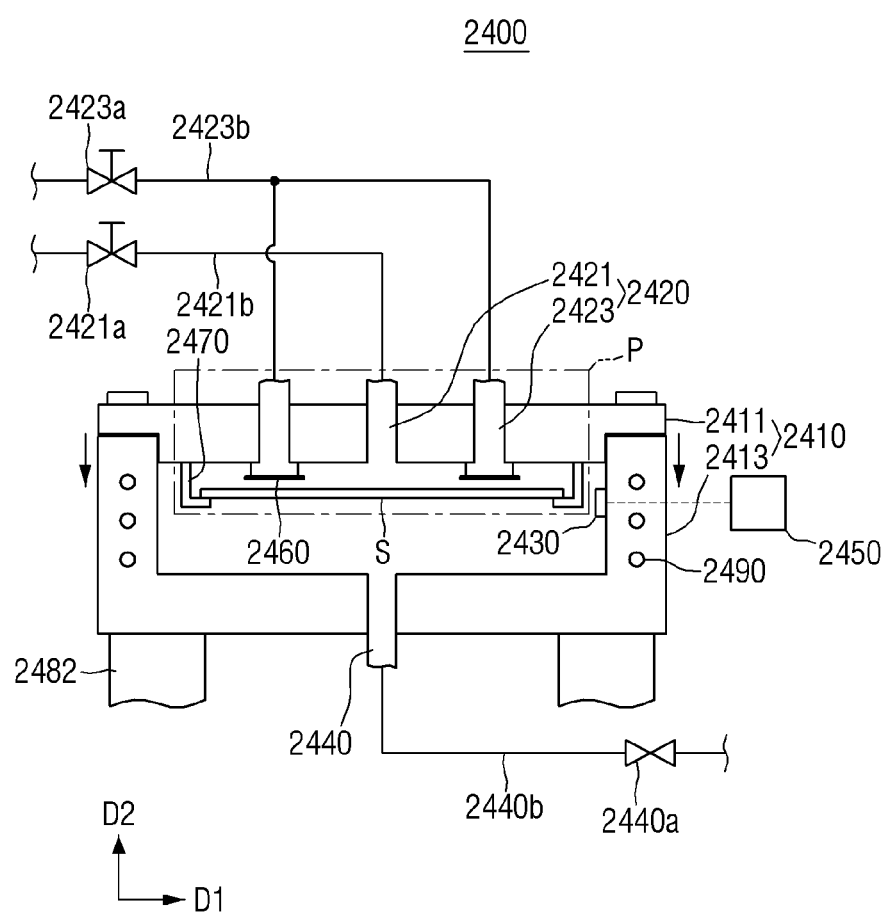

FIGS. 4 and 5 are related cross-sectional views further illustrating the substrate drying module 2400 of FIG. 3 according to embodiments of the inventive concept.

Referring to FIGS. 4 and 5, the substrate drying apparatus 2400 may include the drying chamber 2410, a supply port 2420, a pressure meter 2430, the exhaust port 2440, the controller 2450, and a support member 2470, a first buffer member 2460, an elevating member 2480, and a heating member 2490.

The drying chamber 2410 may provide a processing space in which a supercritical drying process is performed. The drying chamber 2410 may be made of a material capable of withstanding a high pressure greater than or equal to a critical pressure associated with the supercritical drying process.

In the illustrated example of FIGS. 4 and 5, the drying chamber 2410 includes a lower chamber 2413 and an upper chamber 2411 on the lower chamber 2413. That is, the drying chamber 2410 may be divided into an upper portion and a lower portion.

The upper chamber 2411 may be fixed (or fixedly installed), whereas the lower chamber 2413 may be moveable in relation to the upper chamber 2411. In some embodiments, the lower chamber 2413 may be vertically moveable (e.g., may be elevated or lowered) in a second direction D2

(e.g., a vertical direction). Thus, when the lower chamber 2413 is in a lowered position (e.g., separated from the upper chamber 2411), an inner space of the drying chamber 2410 may be more readily accessed. That is, a substrate S may be transferred (or loaded) into the inner space of the drying chamber 2410 for cleaning and/or drying. For example, a substrate contaminated with organic solvent residue following an organic solvent process may be loaded into the drying chamber 2410 for cleaning and/or drying.

Once the substrate has been loaded, the lower chamber 2413 may be raised to an elevated position against the upper chamber 2411 in order to seal the inner space of the drying chamber 2410. Then, the supercritical drying process may be performed within the sealed drying chamber 2410.

Alternately, the drying chamber 2410 may include a positionally fixed lower chamber 2413 and a moveable upper chamber 2411 which may be elevated or lowered to open or seal an inner space.

Accordingly, an elevating member 2480 may be used to selectively elevate or lower the lower chamber 2413. In some embodiments, the elevating member 2480 may include an elevating cylinder 2481 and an elevating rod 2482, wherein the elevating cylinder 2481 is coupled to the lower chamber 2413 to generate a vertical driving force. The elevating cylinder 2481 may generate a driving force sufficient for the drying chamber 2410 to overcome a high pressure greater than or equal to the critical pressure. The elevating cylinder 2481 may generate a driving force sufficient to close the drying chamber 2410 by bringing the upper chamber 2411 and the lower chamber 2413 into close contact while the supercritical drying process is being performed.

Here, one end of the elevating rod 2482 may be inserted into the elevating cylinder 2481 to extend/contract in the vertical direction, and the other end of the elevating rod 2482 may be coupled to the upper chamber 2411.

The design, positioning and/or operation of the elevating rod 2482 should prevent the upper chamber 2411 and the lower chamber 2413 from shifting in a first direction D1 (e.g., a horizontal direction) while the lower chamber 2413 is being moved (e.g., vertically raised or lowered) by the elevating cylinder 2481. Once raised, the elevating rod 2482 may prevent the upper chamber 2411 and the lower chamber 2413 from separating in order to properly seal the inner space.

The support member 2470 may be installed within the upper chamber 2411. For example, the support member 2470 may be coupled to (or hang from) a lower surface of the upper chamber 2411 in such a manner to conveniently position and support the substrate S. In this regard, the substrate S may be variously positioned within the upper chamber 2411 relative to the supply port 2420 and/or the first buffer member 2460 according to the configuration of the support member 2470.

In some embodiments, the support member 2470 may be a structure having a substantially L-shape including a vertical extension attached to the lower surface of the upper chamber 2411 and a horizontal extension (e.g., bent at a 90° angle) at the lower end of the support member 2470. The horizontal extension may provide an edge area configured to horizontally seat the substrate S on the support member 2470. In this manner, the support member 2470 may contact only edge areas on a lower surface of the substrate S. Accordingly, the supercritical drying process may be performed in a fully unobstructed manner over the entirety of an upper surface, as well as almost entirely over the lower surface of the substrate S.

Here, for example, it is assumed that the upper surface of the substrate S is a patterned surface (e.g., a surface on which one or more fine patterns has been formed), and the lower surface of the substrate S is a non-patterned surface. In addition, since the support member 2470 is installed in the fixed upper chamber 2411, the support member 2470 may support the substrate S in a configuration sufficiently stable to allow the vertical movement of the lower chamber 2413 relative to the upper chamber 2411.

The heating member 2490 may be used to control the thermal condition(s) of the drying chamber 2410. In this regard, the heating member 2490 may be used to heat a supercritical fluid (e.g., supercritical carbon dioxide) that is then introduced into the drying chamber 2410 at the critical temperature or higher. That is, the heating member 2490 may be used to develop and maintain the supercritical fluid in a supercritical state. For example, if the supercritical fluid cools and liquefies, the heating member 2490 may be used to return the fluid to a supercritical state. The heating member 2490 may be variously configured (e.g., embedded within wall(s) of the upper chamber 2411 and/or the lower chamber 2413).

The supply port 2420 may be used to supply (or introduce) a supercritical fluid into the drying chamber 2410. The supply port 2420 may be connected to the third and fourth supply lines 2421$b$ and 2423$b$ supplying the supercritical fluid. In this case, the third and fourth valves 2421$a$ and 2423$a$ for controlling the flow rate of the supercritical fluid may be installed in the third and fourth supply lines 2421$b$ and 2423$b$, respectively.

The supply port 2420 may include the main supply port 2421, and at least two sub-supply ports 2423 horizontally spaced apart from the main supply port 2421. Each of the sub-supply ports 2423 may be horizontally spaced apart from the main supply port 2421 at defined intervals.

The main supply port 2421 may be disposed in a substantially central portion of the upper chamber 2411 (e.g., penetrating a central portion of the upper chamber 2411). In this manner, the main supply port 2421 may supply the supercritical fluid to the upper surface of the substrate S supported by the support member 2470.

The main supply port 2421 may inject the supercritical fluid towards a center portion of the upper surface of the substrate S. Hence, the main supply port 2421 may be vertically spaced above the center of the substrate S. Accordingly, the supercritical fluid introduced by the main supply port 2421 may reach the central portion of the substrate S and then spread outward to the edge portions, thereby being uniformly provided to the supercritical fluid across the entire upper surface of the substrate S.

The sub-supply port 2423 may also be formed in the upper chamber 2411 (e.g., may penetrate outer portion(s) of the upper chamber 2411), and may also be used to introduce the supercritical fluid onto the upper surface of the substrate S.

The first buffer member 2460 may be configured within the upper chamber 2411 (e.g., may be attached to the lower surface of the upper chamber 2411), and may be vertically separated (or spaced) from the upper chamber 2411. The first buffer member 2460 may be vertically separated from the sub-supply port 2423 and vertically overlap, at least in part, the sub-supply port 2423.

The first buffer member 2460 may include a first support (e.g., 2462 in FIG. 6) attached to the upper chamber 2411, and a first buffer plate (e.g., 2461 of FIG. 6) extending horizontally. In this manner, the first buffer plate may be disposed between the sub-supply port 2423 and the substrate S.

The first buffer member 2460 may impede (e.g., substantially block) the flow of the supercritical fluid introduced through the sub-supply port 2423 to avoid directly impacting the upper surface of the substrate S with the supercritical fluid. Hence, the first buffer member 2460 may be understood as deflecting the flow direction of the supercritical fluid introduced through the sub-supply port 2423. For example, the flow of the supercritical fluid, as initially introduced through the sub-supply port 2423, may be substantially vertical before being deflected into a substantially horizontal flow by the presence of the first buffer member 2460.

The size, shape and configuration of the first buffer member 2460 will vary by design and desired flow direction(s) and velocities of the supercritical fluid. However, several examples of the first buffer member 2460 are hereafter described in some additional detail with reference to FIGS. 6 to 13.

At the beginning of the supercritical drying process, the internal pressure of the drying chamber 2410 may be low. Accordingly, the flow rate (or velocity) of the supercritical fluid, when initially introduced into the drying chamber 2410, may be quite high. Accordingly, if a high flow rate, supercritical fluid were directly introduced (e.g., in a downward vertical direction) towards the upper surface of the substrate S, structures (e.g., fine patterns) already fabricated on the substrate may be damaged by the flow of supercritical fluid. For example, due to the direct introduction of the supercritical fluid towards the substrate S these structures may become bent, or exhibit a leaning phenomenon under the physical pressure of the supercritical fluid. Alternately or additionally, the substrate S may mechanically vibrate or shake under the force of the supercritical fluid when it is directly introduced upon the substrate S, such that the organic solvent reside undesirably flows further damaging and/or contaminating structures (e.g., patterns) on the substrate S.

Accordingly, at least at the beginning of the supercritical drying process, the supercritical fluid may be introduced into the drying chamber 2410 through only the sub-supply port 2423, as baffled by the first buffer member 2460. In this manner, the supercritical fluid introduced through the sub-supply port 2423 will not be directly introduced towards the substrate S. Once the pressure within the drying chamber 2410 rises under the influence of the introduced supercritical fluid, then the supercritical fluid may be further introduced into the drying chamber 2410 through the main supply port 2421.

Examples of the timing and control of methods of introducing the supercritical fluid will be described in some additional detail with reference to FIGS. 15 and 16.

In some embodiments, the substrate drying apparatus 2400 may further include the exhaust port 2440 (e.g., the exhaust port 2440 penetrating the center portion of the lower chamber 2413). The exhaust port 2440 may be used to discharge the supercritical fluid from the drying chamber 2410. In this regard, the exhaust port 2440 may be connected to the exhaust line 2440b, such that the exhaust line 2440b discharges the supercritical fluid. The fifth valve 2440a may be installed in the exhaust line 2440b in order to adjust the outflow rate of the supercritical fluid.

In some embodiments, the substrate drying apparatus 2400 may further include the pressure meter 2430 disposed within the drying chamber 2410.

For example, the pressure meter 2430 may be provided on side wall of the lower chamber 2413 in order to accurately measure pressure in the drying chamber 2410. In this manner, the pressure meter 2430 may measure the pressure of the supercritical fluid in the drying chamber 2410 and generate a measured pressure value which may be communicated to the controller 2450.

The controller 2450 may be disposed external to the drying chamber 2410. The controller 2450 may be used to determine and control the opening and/or closing (hereafter, "opening/closing") of the supply port 2420 and the exhaust port 2440. According to the pressure value provided from the pressure meter 2430, the controller 2450 may determine when to open the main supply port 2421, the sub-supply port 2423, and the exhaust port 2440.

FIGS. 6 to 13 are respective, enlarged views of the region 'P' indicated in FIG. 5.

Figure 6:
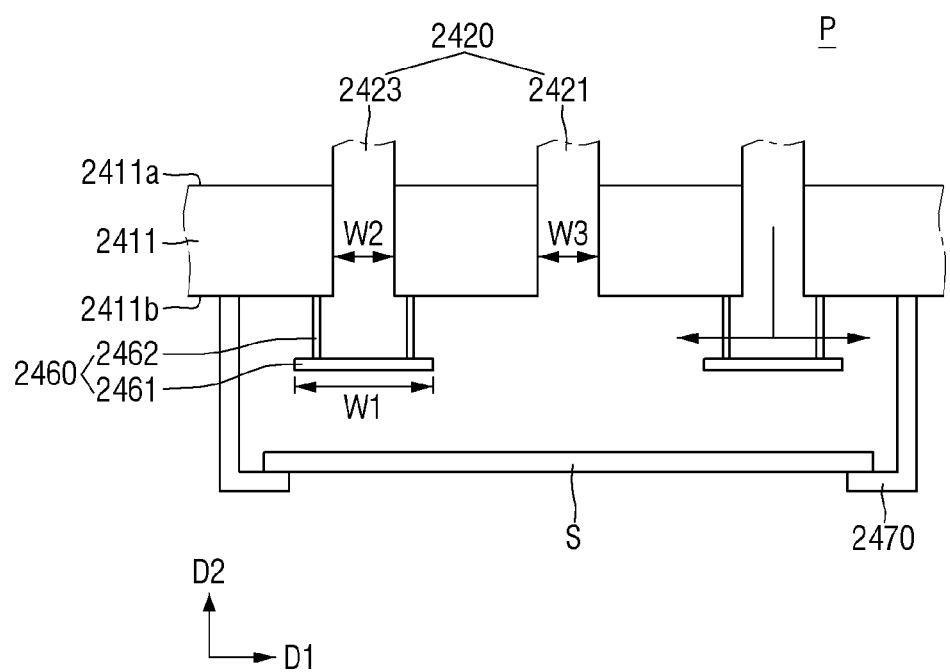
FIGS. 6, 7, 8, 9, 10, 11, 12, and 13 (hereafter collectively, "FIGS. 6 to 13") are respective, enlarged views the region indicated in FIG. 5.

Referring to FIG. 6, the supply port 2420 may include the main supply port 2421 and the sub-supply port 2423.

The main supply port 2421 may penetrate the upper chamber 2411 in order to introduce the supercritical fluid within the drying chamber 2410. The main supply port 2421 may penetrate the upper chamber 2411 in a vertical direction substantially perpendicular to an upper surface 2411a of the upper chamber 2411. For example, the main supply port 2421 may vertically penetrate a center portion of the upper chamber 2411. Accordingly, the supercritical fluid introduced into the drying chamber through the main supply port 2421 may be introduced with a substantially vertical flow.

The sub-supply port 2423 may also vertically penetrate the upper chamber 2411 in order to introduce the supercritical fluid within the drying chamber 2410. Here, the sub-supply port 2423 may penetrate the upper chamber 2411 and be horizontally separated from the main supply port 2421. Of note, the sub-supply port 2423 may include two or more sub-supply ports.

The first buffer member 2460 may be connected to the upper chamber 2411 and may be vertically separated (or spaced apart) from the upper chamber 2411. The first buffer member 2460 may include a first support 2462 connected to the upper chamber 2411 and a first buffer plate 2461 horizontally extending in a direction substantially parallel to the upper chamber 2411.

The first support 2462 may be coupled to the lower surface 2411b of the upper chamber 2411 to extend vertically downward. The first buffer plate 2461 may be coupled to the first support 2462. Accordingly, the first buffer plate 2461 may be vertically separated from the upper chamber 2411.

The first buffer plate 2461 may vertically overlap, at least in part, the sub-supply port 2423, and be disposed between the sub-supply port 2423 and the substrate S. Accordingly, the first buffer plate 2461 may impede the flow of supercritical fluid introduced through the sub-supply port 2423.

In some embodiments, the first buffer plate 2461 may have a first width W1, where "width" is a term measured in the horizontal or first direction D1. The sub-supply port 2423 may have a second width W2, and the main supply port 2421 may have a third width W3.

Here, the first width W1 of the first buffer plate 2461 may be greater than the second width W2 of the sub-supply port 2423. Since the first width W1 is greater than the second width W2, the supercritical fluid introduced through the sub-supply port 2423 may be notably impeded in its downward vertical flow.

The arrows illustrated in FIG. 6 indicate the substantially horizontal flow of the supercritical fluid that result from this impeding function within the drying chamber 2410. That is, the supercritical fluid vertically introduced into the drying chamber 2410 through the sub-supply port 2423 may be deflected into a substantially horizontal flow due to the first buffer plate 2461.

Figure 7:
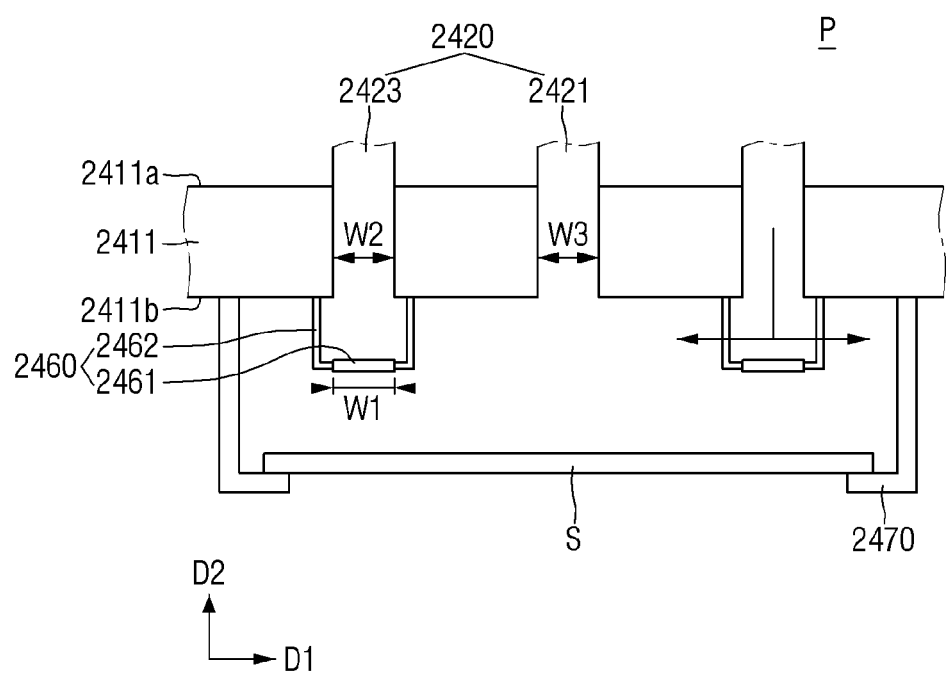

Referring to FIG. 7 by way of comparison with FIG. 6, the first width W1 of the first buffer plate 2461 may be about the same as the second width W2 of the sub-supply port 2423.

Here, since the first width W1 and the second width W2 are about the same, the first buffer plate 2461 may impede (or substantially block) only a portion of the vertical supercritical fluid flow introduced through the sub-supply port 2423 that directly impacts the substrate S. As before, the first buffer plate 2461 may extend substantially in parallel with the substrate S (e.g., horizontally within the drying chamber 2410. Accordingly, the first buffer plate 2461 may be generally be used to change (or adjust) the flow direction of the supercritical fluid.

Figure 8:
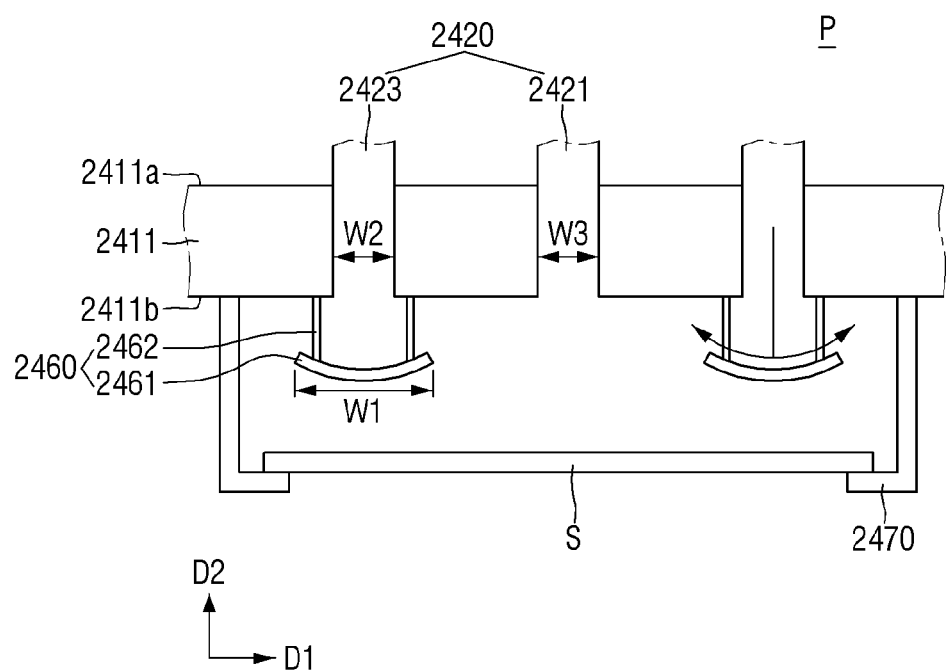

Referring to FIG. 8 by way of comparison with FIG. 6, the first buffer plate 2461 may have a convex shape relative to the sub-supply port 2423.

That is, the first buffer plate 2461 may have a concave shape with respect to the substrate S. For example, the vertical interval between the first buffer plate 2461 and the sub-supply port 2423 may decrease moving from the center portion of the first buffer plate 2461 towards edge portions of the first buffer plate 2461, and the vertical interval between the first buffer plate 2461 and the substrate S may increase moving from the center portion of the first buffer plate 2461 to edge portions of the first buffer plate 2461.

Here again, the arrows illustrated in FIG. 8 indicate flow direction for the supercritical fluid once introduced into the drying chamber 2410. Depending on the shape (e.g., the degree of curve) of the first buffer plate 2461, the flow direction of the supercritical fluid may be varied once introduced through the sub-supply port 2423. For example, the convex-shaped first buffer plate 2461 may vary the flow direction of the supercritical fluid in a non-linear manner (e.g., according to a direction other than substantially vertical and substantially horizontal).

Figure 9:
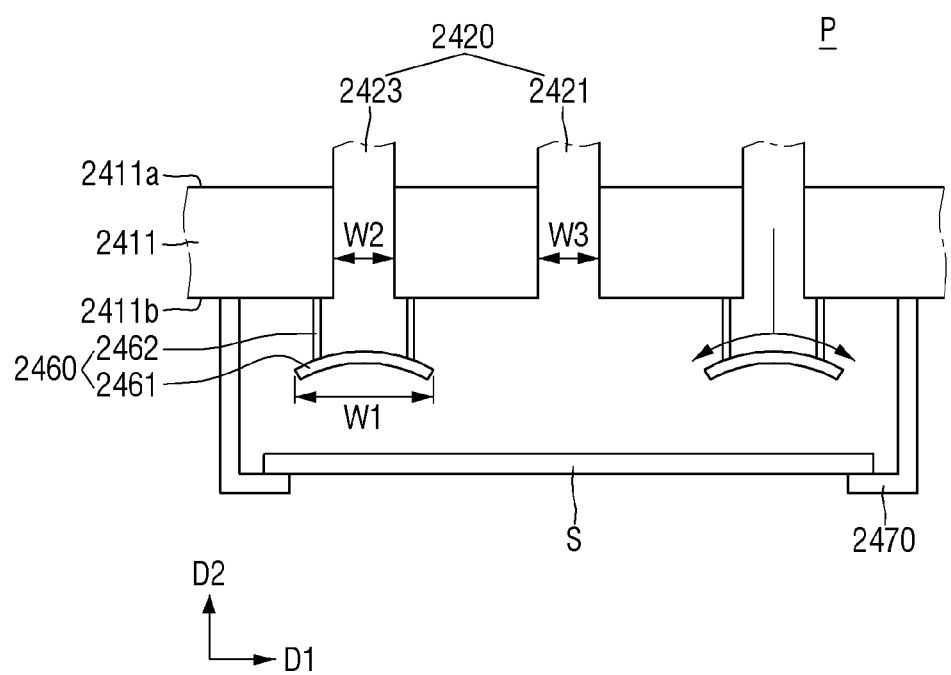

Referring to FIG. 9 by way of comparison with FIG. 6, the first buffer plate 2461 may have a concave shape with respect to the sub-supply port 2423.

That is, the first buffer plate 2461 may have a convex shape with respect to the substrate S. For example, the vertical interval between the first buffer plate 2461 and the sub-supply port 2423 may increase moving from the center portion of the first buffer plate 2461 towards the edge portions of the first buffer plate 2461, and the vertical interval between the first buffer plate 2461 and the substrate S may decrease moving from the center portion of the first buffer plate 2461 to the edge portions of the first buffer plate 2461.

Here again, the arrows illustrated in FIG. 9 indicate flow direction for the supercritical fluid once introduced into the drying chamber 2410. Depending on the shape (e.g., the degree of curve) of the first buffer plate 2461, the flow direction of the supercritical fluid may be varied once introduced through the sub-supply port 2423. For example, the concave-shaped first buffer plate 2461 may vary the flow direction of the supercritical fluid in a non-linear manner (e.g., according to a direction other than substantially vertical and substantially horizontal).

Figure 10:
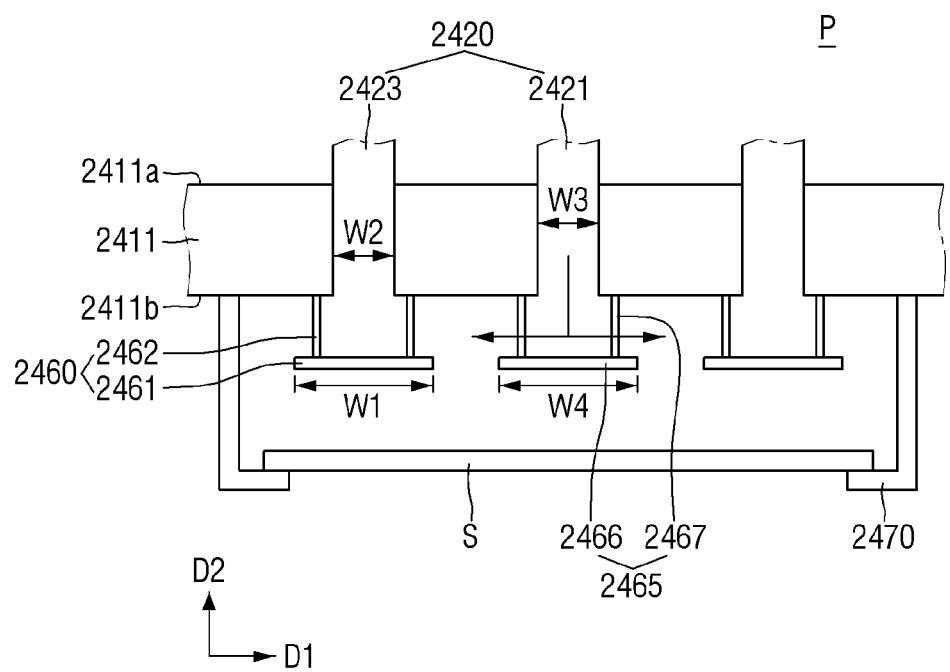

Referring to FIG. 10 by way of comparison with FIG. 6, the substrate drying apparatus may further include a second buffer member 2465 connected to the upper chamber 2411.

The second buffer member 2465 may be vertically spaced apart from the main supply port 2421 and may vertically overlap, at least in part, the main supply port 2421.

The second buffer member 2465 may include a second support 2467 and a second buffer plate 2466, wherein the second support 2467 may be coupled to the upper chamber 2411 and extend vertically downward and the second buffer plate 2466 may be coupled to the second support 2467 and extend horizontally.

The second buffer plate 2466 may vertically overlap the main supply port 2421, at least in part. The second buffer plate 2466 may be disposed between the main supply port 2421 and the substrate S. Accordingly, the second buffer plate 2466 may impede the flow of the supercritical fluid introduced through the main supply port 2421 from being directly impacting the substrate S.

The second buffer plate 2466 may have a fourth width W4. The main supply port 2421 may have the third width W3.

In some embodiments, the fourth width W4 of the second buffer plate 2466 may be greater than or equal to the third width W3 of the main supply port 2421.

Since the fourth width W4 is greater than the third width W3, the downward vertical flow of the supercritical fluid introduced through the main supply port 2421 may be impeded such that it does not directly impact the substrate S, as previously described in relation to FIG. 6.

Figure 11:
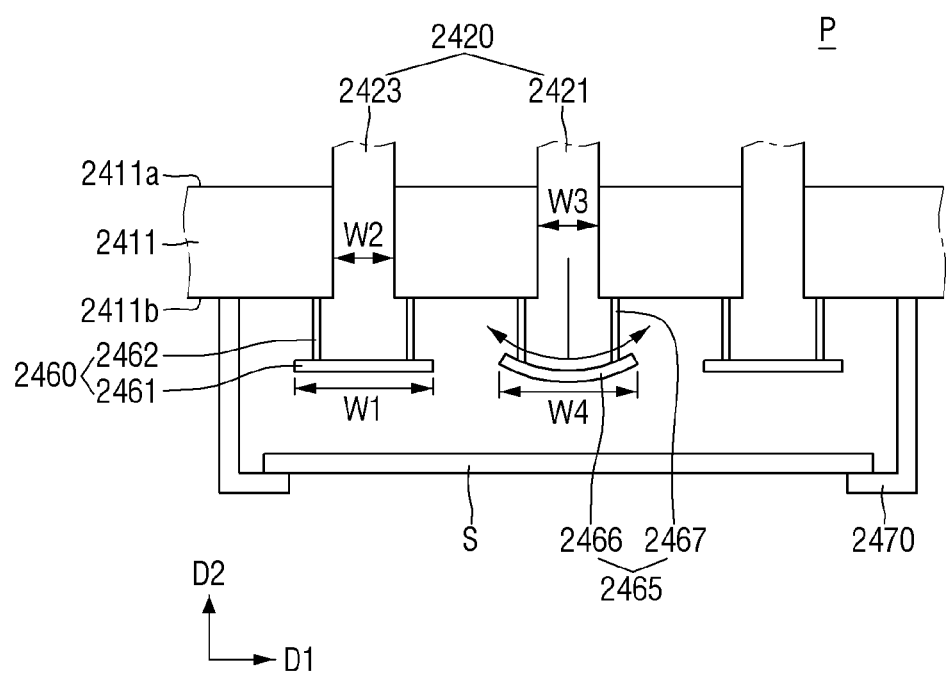

Referring to FIG. 11 by way of comparison with FIG. 10, the second buffer plate 2465 may have a convex shape with respect to the main supply port 2421.

That is, the second buffer plate 2466 may have a concave shape with respect to the substrate S. For example, the vertical interval between the second buffer plate 2466 and the main supply port 2421 may decrease moving from the center portion of the second buffer plate 2466 towards the edge portions of the second buffer plate 2466, and the vertical interval between the second buffer plate 2466 and the substrate S may increase moving from the center portion of the second buffer plate 2466 towards the edge portions of the second buffer plate 2466, as previously described in relation to FIG. 8.

Figure 12:
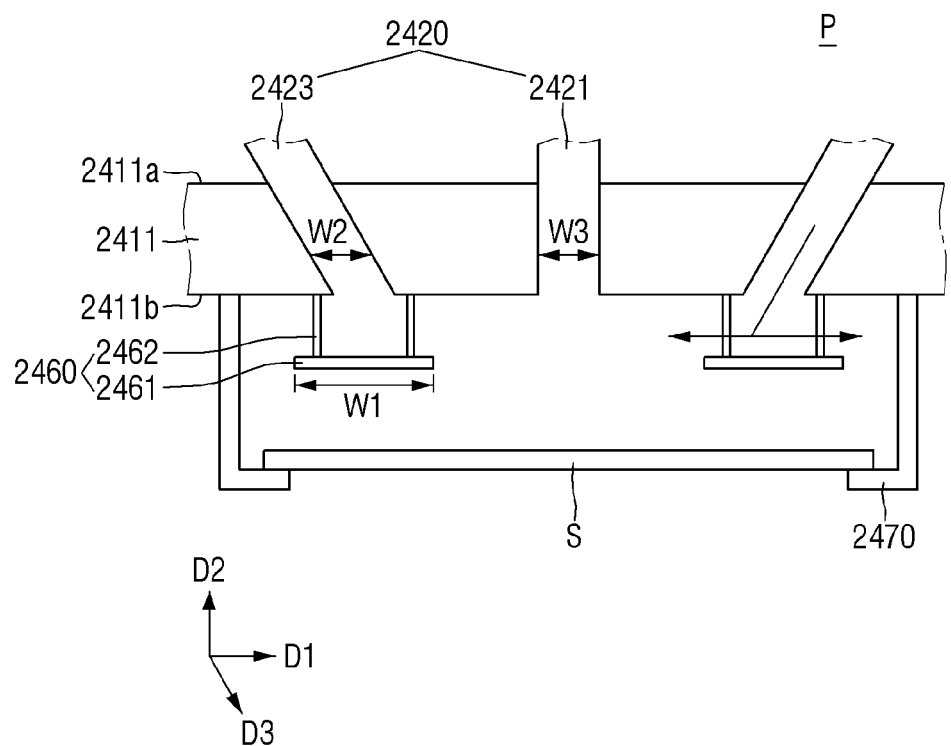

Referring to FIG. 12 by way of comparison with FIG. 6, the sub-supply port 2423 may penetrate the upper chamber 2411 at a third direction D3 other than the horizontal or first direction, or the vertical or second direction D2. Here, the third direction D3 may range from between the second direction D2 and the first direction D1.

The penetration direction of the sub-supply port 2423 may be oriented from the outer periphery of the upper chamber 2411 towards the center of the upper chamber 2411 as going from the upper surface 2411a of the upper chamber 2411 to the lower surface 2411b of the upper chamber 2411.

The first buffer plate 2461 may be disposed between the sub-supply port 2423 and the substrate S. Accordingly, the first buffer plate 2461 may impede the flow of the supercritical fluid introduced through the sub-supply port 2423, such that it does not directly impact the substrate S.

As the sub-supply port 2423 penetrates in the third direction D3, the supercritical fluid may be introduced into the drying chamber 2410 in the third direction D3. The first buffer plate 2461 may change the flow direction of the supercritical fluid. For example, the first buffer plate 2461 may change the flow direction of the supercritical fluid introduced at an angle ranging from between the third direction D3 to the first direction D1.

Figure 13:
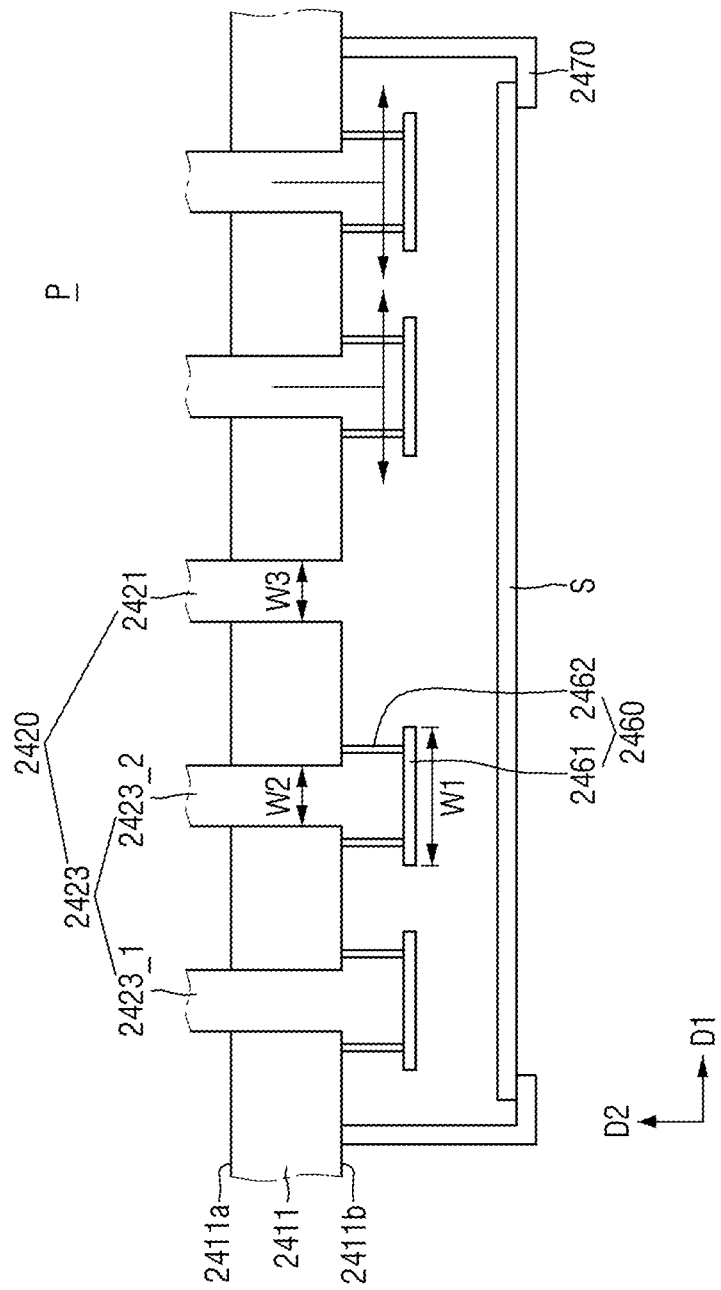

Referring to FIG. 13 by way of comparison with FIG. 6, the sub-supply port 2423 may include a first sub-supply port 2423_1 and a second sub-supply port 2423_2.

The first sub-supply port 2423_1 may be horizontally spaced apart from the main supply port 2421. The second sub-supply port 2423_2 may be positioned between the first sub-supply port 2423_1 and the main supply port 2421. That is, the second sub-supply port 2423_2 may be spaced apart from the main supply port 2421 in the first direction D1. The second sub-supply port 2423_2 may be horizontally spaced apart from the first sub-supply port 2423_1.

Figure 14:
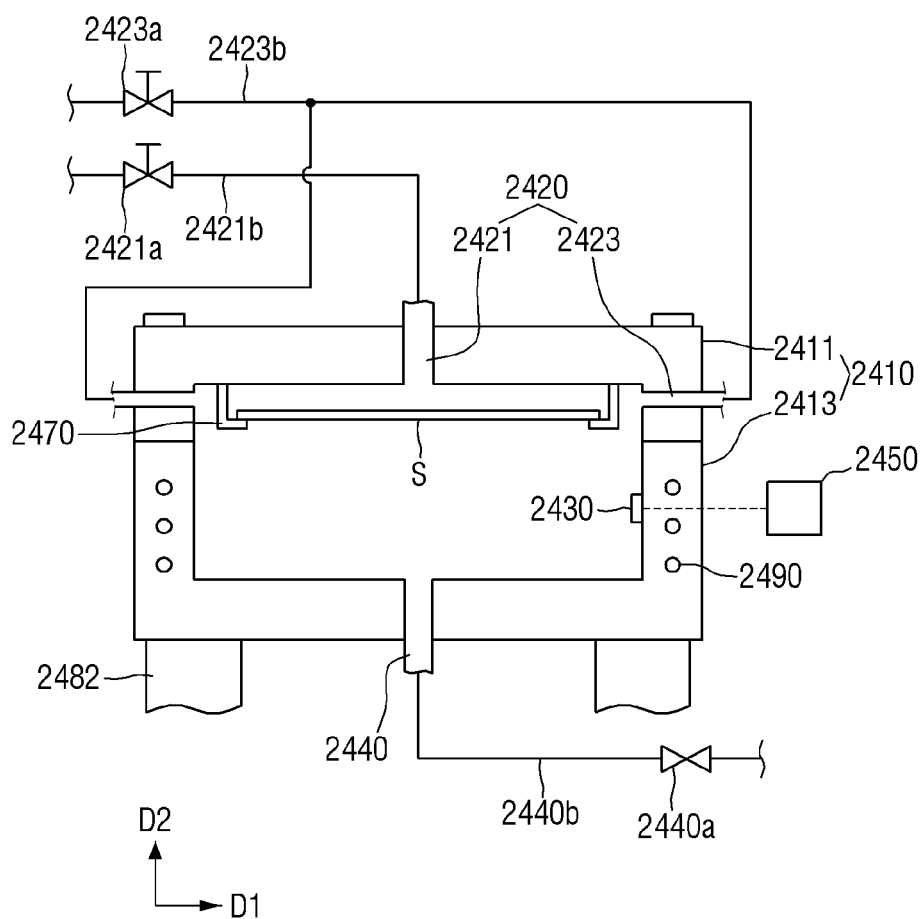
FIG. 14 is a cross-sectional view illustrating a substrate drying apparatus according to embodiments of the inventive concept.

FIG. 14 is a cross-sectional view illustrating the substrate drying module 2400 of FIG. 1 according to embodiments of the inventive concept.

Referring to FIG. 14, the sub-supply port 2423 may penetrate one or more side portion(s) of the upper chamber 2411.

That is, the sub-supply port 2423 may horizontally penetrate side portion(s) of the upper chamber 2411 (or in a direction substantially parallel to the substrate S loaded into substrate drying module 2400). Accordingly, the flow direction of the supercritical fluid introduced into the drying chamber 2410 through the sub-supply port 2423 may be substantially horizontal in nature, and since the flow of the supercritical fluid is not directed vertically downward towards the substrate S. there is little danger of damage to structures fabricated n the substrate S.

Figure 15:
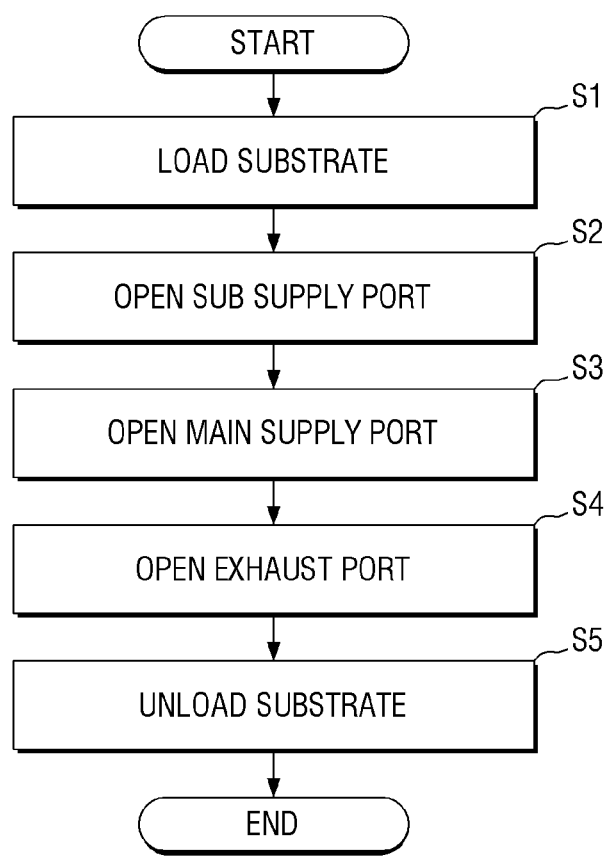
FIG. 15 is a flowchart illustrating a substrate drying method using a substrate drying apparatus according to embodiments of the inventive concept.

FIG. 15 is a flowchart illustrating a substrate drying method using a substrate drying apparatus according to embodiments of the inventive concept. FIG. 16 is a graph illustrating a substrate drying method using a substrate drying apparatus according to embodiments of the inventive concept. Referring to FIGS. 15 and 16, one example of the timing and method of introducing the supercritical fluid will be described.

Referring to FIGS. 4 and 15, the substrate drying method according to embodiments of the inventive concept may include five principal method steps (e.g., steps S1, S2, S3, S4, and S5).

In step S1, the substrate S is loaded into the drying chamber 2410. In step S2, the supercritical fluid is introduced into the drying chamber 2410 by opening the sub-supply port 2423. In step S3, the supercritical fluid is introduced into the drying chamber 2410 by opening the main supply port 2421. The supercritical fluid introduced through the sub-supply port 2423 and the main supply port 2421 may dry the substrate S in the drying chamber 2410. In step S4, the supercritical fluid is discharged from the drying chamber 2410 by opening the exhaust port 2440, and in step S5, the substrate S is unloaded from the drying chamber 2410.

Figure 16:
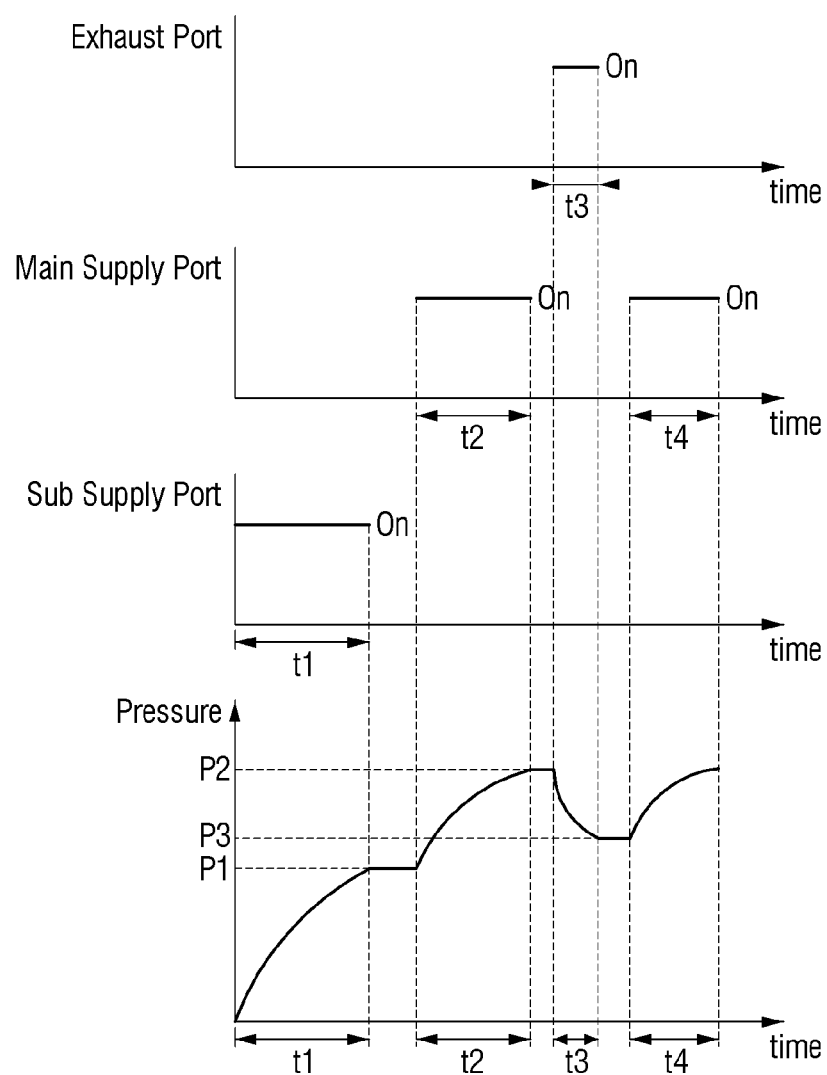
FIG. 16 is a graph further illustrating a substrate drying method using a substrate drying apparatus according to embodiments of the inventive concept.

Referring to FIGS. 4 and 16, the sub-supply port 2423 may provide the supercritical fluid into the drying chamber 2410 at the beginning of time period t1.

The pressure meter 2430 may measure the pressure inside the drying chamber 2410. The pressure value measured by the pressure meter 2430 may be the pressure of the supercritical fluid in the drying chamber 2410.

The controller 2450 may determine when to open the main supply port 2421, the sub-supply port 2423, and the exhaust port 2440. The controller 2450 may receive the pressure value measured by the pressure meter 2430. For example, the controller 2450 may determine when to open the main supply port 2421, the sub-supply port 2423, and the exhaust port 2440 according to the pressure value transmitted from the pressure meter 2430.

The controller 2450 may open the sub-supply port 2423 when the supercritical drying process starts. The sub-supply port 2423 may be open during time period t1. Once the sub-supply port 2423 is opened at time t1, the pressure inside the drying chamber 2410 will ultimately reach a first pressure P1. When the pressure value measured by the pressure meter 2430 reaches the first pressure P1, the controller 2450 may close the sub-supply port 2423.

The controller 2450 may open the main supply port 2421 when the pressure value reaches the first pressure P1. The main supply port 2421 may be opened at time t2. During second time period t2, the supercritical fluid may be introduced into the drying chamber 2410 through the main supply port 2421. The second time period t2 may be different in duration than the first time period t1.

When the main supply port 2421 is open during the second time period t2, the pressure inside the drying chamber 2410 may reach a second pressure P2. The second pressure P2 may be, for example, a pressure greater than the first pressure P1. When the pressure value measured by the pressure meter 2430 reaches the second pressure P2, the controller 2450 may close the main supply port 2421.

The controller 2450 may open the exhaust port 2440 when the pressure value reaches the second pressure P2. The exhaust port 2440 may be open during a third time period t3. During the third time period t3, the supercritical fluid may be discharged from the drying chamber 2410 through the exhaust port 2440. The third time period t3 may be different in duration from the second time period t2.

When the exhaust port 2440 is open during the third time period t3, the pressure inside the drying chamber 2410 may reach a third pressure P3. The third pressure P3 may be, for example, a pressure greater than the first pressure P1, and less than the second pressure P2. When the pressure value measured by the pressure meter 2430 reaches the third pressure P3, the controller 2450 may close the exhaust port 2421.

When the input value reaches the third pressure P3, the controller 2450 may again open the main supply port 2421. The main supply port 2421 may be open during a fourth time period t4.

That is, the supply of the supercritical fluid into the drying chamber 2410 using the main supply port 2421 may be performed two or more times. Discharge of the supercritical fluid from the drying chamber 2410 using the exhaust port 2440 may also be performed two or more times.

FIGS. 17, 18, 19 and 20 are related cross-sectional views illustrating steps of a substrate drying method according to embodiments of the inventive concept.

Figure 17:
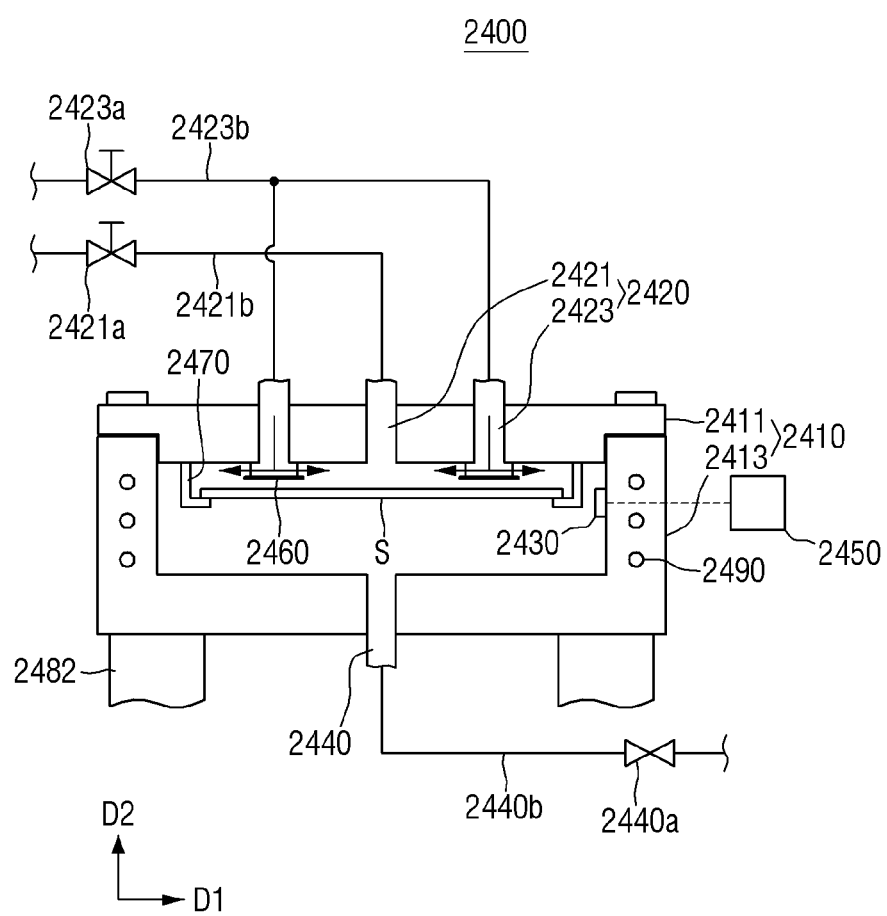
FIGS. 17, 18, 19 and 20 are related cross-sectional views further illustrating exemplary steps in a substrate drying method according to embodiments of the inventive concept.

Referring to FIG. 17, the sub-supply port 2423 may vertically penetrate an upper portion of the upper chamber 2411.

The supercritical fluid may be vertically and the horizontally introduced into the drying chamber 2410 through the sub-supply port 2423. That is, the first buffer member 2460 may be used to change the flow direction of the supercritical fluid. When the supercritical fluid is introduced into the drying chamber 2410 through the sub-supply port 2423, the pressure in the drying chamber 2410 will increase.

Figure 18:
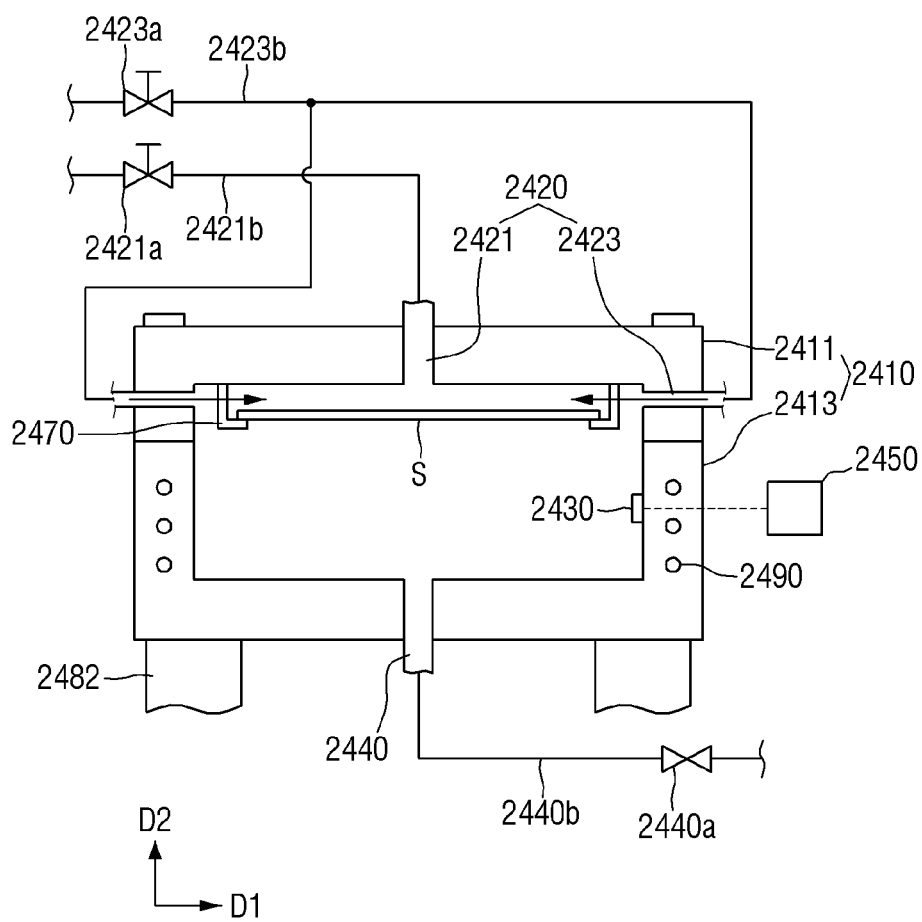

Referring to FIG. 18, the sub-supply port 2423 may horizontally penetrate at least one side portion of the upper chamber 2411.

Thus, the supercritical fluid may be horizontally introduced into the drying chamber 2410 through the sub-supply port 2423 in manner that does not directly impact (and potentially damage) the substrate S. When the supercritical fluid is introduced into the drying chamber 2410 through the sub-supply port 2423, the pressure in the drying chamber 2410 will increase.

Figure 19:
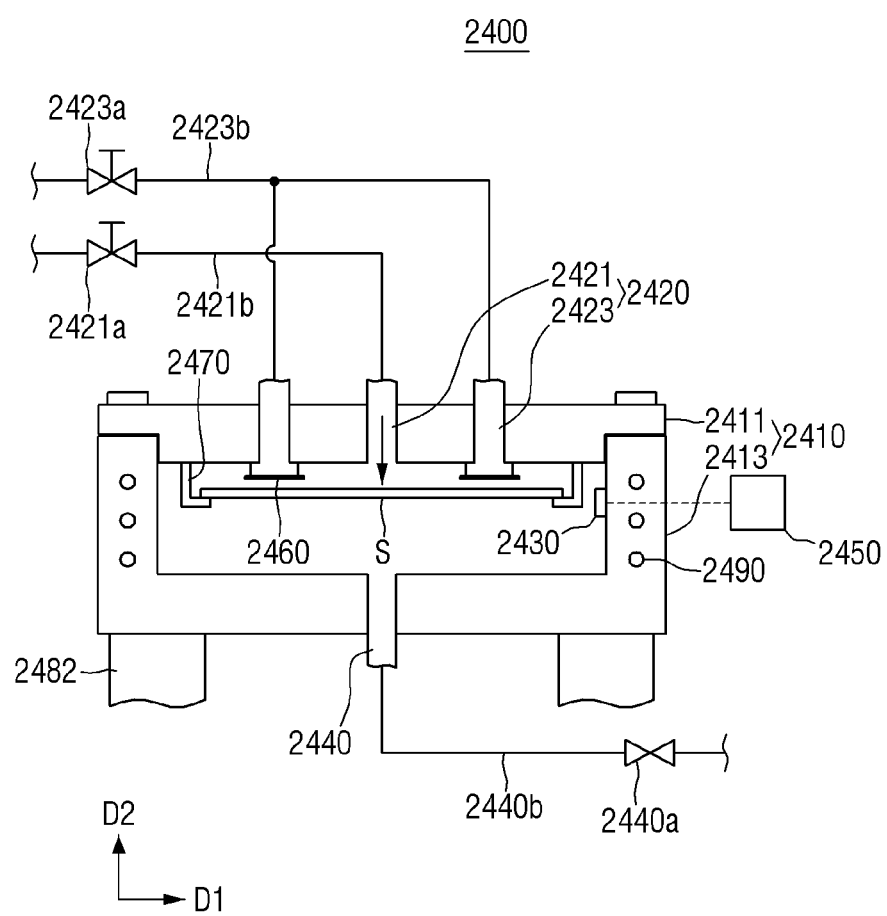

Referring to FIG. 19, the main supply port 2421 may vertically penetrate the center of the upper chamber 2411.

Hence, the supercritical fluid may be vertically introduced into the drying chamber 2410 through the main supply port 2421.

Before the main supply port 2421 is opened, the pressure of the supercritical fluid inside the drying chamber 2410 may be high. Accordingly, the flow rate of the supercritical fluid introduced through the main supply port 2421 may be relatively slow.

Figure 20:
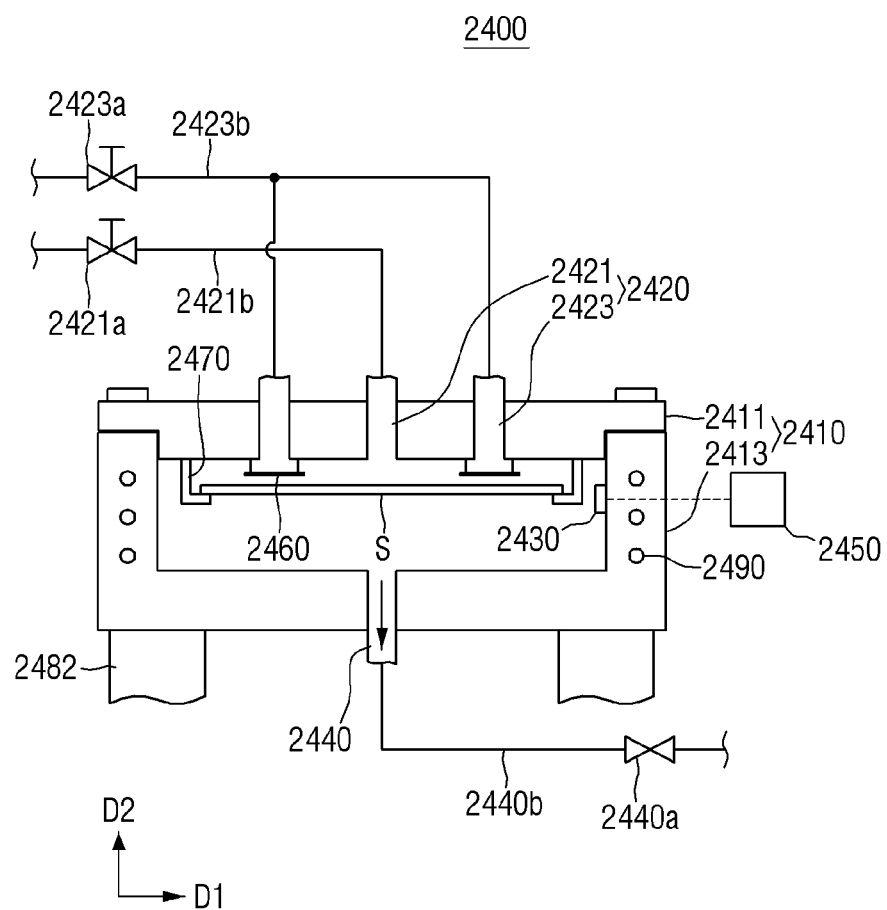

Referring to FIG. 20, the exhaust port 2440 may vertically penetrate a center portion of the lower chamber 2413.

Hence, the supercritical fluid may be vertically discharged from the drying chamber 2410 through the exhaust port 2440.

When substantially all of the supercritical fluid is discharged from the drying chamber 2410, the supercritical drying process of the inventive concept may be ended.

Hereinafter, a method of manufacturing a semiconductor device using a substrate drying apparatus according to some embodiments of the inventive concept will be described with reference to FIGS. 1, 5 and 15.

In some embodiments, a semiconductor device manufacturing method may include performing a supercritical drying process. The supercritical drying process may be performed using the substrate drying apparatus 2400 of the inventive concept.

Specifically, the substrate S may be loaded into a substrate processing apparatus including the substrate drying apparatus 2400 of the inventive concept. The substrate S may be carried into the index module 1000. The index module 1000 may receive the substrate S and transfer the substrate S to the process module 2000.

The process module 2000 may be a module that actually performs a process. The process module 2000 may include the buffer module 2100, the transfer module 2200, the cleaning module 2300, and the drying module 2400. The drying module 2400 may be the substrate drying apparatus 2400 of the inventive concept.

The index module 1000 may transfer the substrate S to the cleaning module 2300. The substrate S may be loaded into the cleaning module 2300. The cleaning module 2300 may clean the loaded substrate S.

The index module 1000 may transfer the substrate S to the substrate drying apparatus 2400. The substrate S may be loaded into the substrate drying apparatus 2400. The substrate drying apparatus 2400 may dry the loaded substrate S.

Those skilled in the art will appreciate that many variations and modifications may be made to the illustrated embodiments without substantially departing from the principles of the inventive concept.

What is claimed is:

1. A substrate drying apparatus comprising:
   a drying chamber configured to load a substrate and including a lower chamber and an upper chamber above the lower chamber;
   a supply port configured to introduce a supercritical fluid into the drying chamber and including a main supply port and a sub-supply port horizontally spaced apart from the main supply port, wherein the main supply port penetrates a center portion of the upper chamber; and
   a pressure meter configured to measure pressure of the supercritical fluid in the drying chamber and generate a measured pressure value,
   wherein the supercritical fluid is configured to be introduced into the drying chamber through the sub-supply port during a first time period, and the supercritical fluid is configured to be introduced into the drying chamber through the main supply port during a second time period following the first time period after stopping supply of the supercritical fluid through the sub-supply port.

2. The substrate drying apparatus of claim 1, further comprising:
   an exhaust port configured to discharge the supercritical fluid from the drying chamber; and
   a controller configured to control operation of at least one of the supply port and the exhaust port in response to the measured pressure value.

3. The substrate drying apparatus of claim 2, wherein the controller opens the sub-supply port before the measured pressure value reaches a first pressure, and the controller opens the main supply port after the measured pressure value reaches the first pressure.

4. The substrate drying apparatus of claim 3, wherein the controller opens the exhaust port when the measured pressure value reaches a second pressure, and the second pressure is greater than the first pressure.

5. The substrate drying apparatus of claim 4, wherein the controller closes the exhaust port when the measured pressure value reaches a third pressure, and the third pressure is less than the second pressure.

6. The substrate drying apparatus of claim 2, wherein the controller causes a discharge of the supercritical fluid from the drying chamber during a third time period following the first time period and the second time period.

7. The substrate drying apparatus of claim 1, wherein the sub-supply port horizontally penetrates a side portion of the upper chamber.

8. A substrate drying apparatus comprising:
   a drying chamber configured to load a substrate and including a lower chamber and an upper chamber above the lower chamber;
   a supply port configured to supply a supercritical fluid into the drying chamber and including a main supply port and a sub-supply port horizontally spaced apart from the main supply port, wherein the main supply port penetrates a center portion of the upper chamber; and
   a first buffer member coupled to the upper chamber, vertically separated from the sub-supply port, and including a first buffer plate vertically overlapping only the sub-supply port among the sub-supply port and the main supply port, such that supercritical fluid vertically introduced into the drying chamber through the sub-supply port is impeded by the first buffer plate to change a flow direction for the supercritical fluid.

9. The substrate drying apparatus of claim 8, wherein the first buffer plate has a convex shape with respect to the sub-supply port.

10. The substrate drying apparatus of claim 8, wherein the first buffer plate has a concave shape with respect to the sub-supply port.

11. The substrate drying apparatus of claim 8, wherein a width of the first buffer plate is greater than a width of the sub-supply port.

12. The substrate drying apparatus of claim 8, further comprising:
    a second buffer member coupled to the upper chamber, vertically separated from the main supply port, and including a second buffer plate vertically overlapping the main supply port, such that supercritical fluid vertically introduced into the drying chamber through the main supply port is impeded by the second buffer plate to change a flow direction for the supercritical fluid.

13. The substrate drying apparatus of claim 12, wherein the second buffer plate has a convex shape with respect to the main supply port.

14. The substrate drying apparatus of claim 8, wherein the sub-supply port includes a first sub-supply port and a second sub-supply port between the first sub-supply port and the main supply port.

15. The substrate drying apparatus of claim 8, wherein the sub-supply port penetrates the upper chamber at a direction.

16. The substrate drying apparatus of claim 15, wherein the direction is oriented from an outer periphery of the upper chamber to the center of the upper chamber going from an upper surface of the upper chamber to a lower surface of the upper chamber.

17. The substrate drying apparatus of claim 8, wherein the main supply port and the sub-supply port both penetrate the upper chamber.

18. A substrate drying apparatus comprising:
    a drying chamber configured to load a substrate and including a lower chamber and an upper chamber above the lower chamber;
    a supply port configured to supply a supercritical fluid into the drying chamber and including a main supply port and a sub-supply port horizontally spaced apart from the main supply port, wherein the main supply port penetrates a center portion of the upper chamber; and
    a first buffer member coupled to the upper chamber, vertically separated from the sub-supply port, and including a first buffer plate vertically overlapping the sub-supply port, such that supercritical fluid vertically introduced into the drying chamber through the sub-supply port is impeded by the first buffer plate to change a flow direction for the supercritical fluid,
    wherein the main supply port and the sub-supply port both penetrate the upper chamber.

19. The substrate drying apparatus of claim 18, further comprising:
    a second buffer member coupled to the upper chamber, vertically separated from the main supply port, and including a second buffer plate vertically overlapping the main supply port, such that supercritical fluid vertically introduced into the drying chamber through the main supply port is impeded by the second buffer plate to change a flow direction for the supercritical fluid.

20. The substrate drying apparatus of claim 18, wherein the sub-supply port includes a first sub-supply port and a second sub-supply port between the first sub-supply port and the main supply port.

* * * * *